United States Patent
Jung et al.

(10) Patent No.: US 8,063,853 B2
(45) Date of Patent: Nov. 22, 2011

(54) ORGANIC LIGHT-EMITTING DIODE DISPLAY

(75) Inventors: Kwang-Chul Jung, Seongnam-si (KR); Beohm-Rock Choi, Seoul (KR); Joon-Chul Goh, Seoul (KR)

(73) Assignee: Samsung Electronics Co., Ltd. (KR)

( * ) Notice: Subject to any disclaimer, the term of this patent is extended or adjusted under 35 U.S.C. 154(b) by 1101 days.

(21) Appl. No.: 11/600,342

(22) Filed: Nov. 15, 2006

(65) Prior Publication Data

US 2007/0115226 A1 May 24, 2007

(30) Foreign Application Priority Data

Nov. 18, 2005 (KR) .................. 10-2005-0110669

(51) Int. Cl.
*G09G 3/30* (2006.01)
(52) U.S. Cl. ........................................ 345/76
(58) Field of Classification Search .............. 345/76–83, 345/204
See application file for complete search history.

(56) References Cited

U.S. PATENT DOCUMENTS

| | | | | |
|---|---|---|---|---|
| 6,380,672 | B1 * | 4/2002 | Yudasaka | 313/504 |
| 6,583,776 | B2 * | 6/2003 | Yamazaki et al. | 345/77 |
| 2005/0052590 | A1 * | 3/2005 | Ochiai et al. | 349/71 |

FOREIGN PATENT DOCUMENTS

| | | | |
|---|---|---|---|
| JP | 09-026564 | * | 1/1997 |
| JP | 2003-108033 | | 4/2003 |
| JP | 2004-264673 | | 9/2004 |
| KR | 1020030069668 | | 8/2003 |
| KR | 1020030093977 | | 12/2003 |

OTHER PUBLICATIONS

English Language Abstract, JP Patent First Publication No. 2004-264673, Sep. 24, 2004, 1 page.
English Language Abstract, KR Patent First Publication No. 1020030093977, Dec. 11, 2003, 1 page.
English Language Abstract, KR Patent First Publication No. 1020030069668, Aug. 27, 2003, 1 page.
English Language Abstract, JP Patent First Publication No. 2003-108033, Apr. 11, 2003, 1 page.

* cited by examiner

*Primary Examiner* — Sumati Lefkowitz
*Assistant Examiner* — Robert E Carter, III
(74) *Attorney, Agent, or Firm* — Innovation Counsel LLP

(57) ABSTRACT

An organic light emitting diode (OLED) display includes a first pixel including a first light emitting diode, a first driving transistor connected to the first light emitting diode and having a first terminal, a second terminal, and a third terminal, and a first storage capacitor connected between the first terminal and the second terminal of the first driving transistor, and a second pixel including a second light emitting diode, a second driving transistor connected to the second light emitting diode and having a first terminal, a second terminal, and a third terminal, and a second storage capacitor connected between the first terminal and the second terminal of the second driving transistor, wherein the first storage capacitor has a different capacitance than the second storage capacitor.

20 Claims, 6 Drawing Sheets

ORGANIC LIGHT-EMITTING DIODE DISPLAY

CROSS-REFERENCE TO RELATED APPLICATION

This application claims priority to and the benefit of Korean Patent Application No. 10-2005-0110669 filed in the Korean Intellectual Property Office on Nov. 18, 2005, the contents of which are incorporated herein by reference.

FIELD OF THE INVENTION

The present invention relates to an organic light-emitting diode (OLED) display.

DESCRIPTION OF THE RELATED ART

Flat panel displays include the liquid crystal display (LCD), the field emission display (FED), the organic light-emitting diode (OLED) display, the plasma display panel (PDP), etc. Among the flat panel displays, the OLED has low power consumption, fast response time, wide viewing angle, and high contrast ratio. An OLED display is a self-emissive display device that includes two electrodes with an organic light-emitting layer between them. One of the two electrodes injects holes and the other injects electrons into the light-emitting layer. The injected electrons and holes are combined to form exitons and the exitons emit light as discharge energy. The OLED displays may be divided into passive matrix OLED displays and active matrix OLED displays according to their driving method.

The passive matrix OLED display includes a plurality of anode lines, a plurality of cathode lines intersecting the anode lines, and a plurality of pixels each including a light emission layer. The selection of one of the anode lines and one of the cathode lines causes the pixel located at the intersection of the selected signal lines to emit light.

The active matrix OLED display includes a plurality of pixels each including a switching transistor, a driving transistor, and a storage capacitor, as well as an anode, a cathode, and a light emission layer. The driving transistor receives a data voltage from the switching transistor and drives a current having a magnitude determined depending on the data voltage, and the current from the driving transistor enters the light emission layer to cause light emission of an intensity depending on the current. The OLED is classified either as a bottom-emission type or a top-emission type depending on the light-emitting direction. In the bottom-emission type, the light is emitted toward the top of the substrate provided with a thin film transistor, while the light is emitted in the opposite direction in the top-emission type. In the bottom-emission type, the light is not transmitted through the area that has the thin film transistor and the signal lines, such as wiring, while the light emission area may not relate to the area provided with the thin film transistor and wiring in the top-emission type. Accordingly the aperture ratio of the top-emission type may be greater than the aperture ratio of the bottom-emission type. However, in the top-emission OLED, there may be a height difference between the regions having the TFTs and wiring and the other regions, and therefore the thickness of the light-emitting layer may be non-uniform, especially when the light-emitting layer is made of soluble materials.

In the active matrix OLED display, when a voltage applied to a control electrode of the switching transistor is changed from a gate-on voltage into a gate-off voltage, a kickback voltage occurs due to parasitic capacitance between the control electrode and an output electrode of the switching transistor. The kickback voltage decreases the voltage applied to the control electrode of the driving transistor to decrease the output current from the driving transistor and thereby decrease the luminance of the OLED display.

SUMMARY OF THE INVENTION

An exemplary embodiment of the present invention provides an organic light-emitting diode (OLED) display which includes a first, second and third pixel each including a different color of light-emitting diode, each light-emitting diode having a respective driving transistor having capacitor of different capacitance connected between its control terminal and input terminals. One of the light-emitting diodes may have a lower luminous efficiency than the other of the light-emitting diodes. One of the light-emitting diodes may emit light of a blue color, another may emits a green or red color. The OLED display may further include a respective switching transistor connected to the driving transistor. One of the driving transistors may have a wider channel width than another of the driving transistors but may have the same area as the other light-emitting diode.

Another embodiment of the present invention, illustrated in FIG. 1, provides an organic light-emitting diode (OLED) display having data lines, driving voltage lines and gate lines, a switching transistor having its control electrode connected to a gate line, its input electrode connected to a data line and its output electrode connected to the control electrode of a driving transistor, the driving transistor having its input terminal connected to a driving voltage line and its output electrode connected to a light-emitting diode, wherein a capacitor, connected between the control terminal of the driving transistor and the driving voltage line, when charged through the switching transistor to the threshold voltage of the driving transistor, turns on the driving transistor to apply the driving voltage to the light emitting diode.

Another embodiment of the present invention, illustrated in FIG. 4, provides an organic light-emitting diode (OLED) display having data lines, driving voltage lines and gate lines, first and second switching transistors having control electrodes connected to a gate line, input electrodes connected to a data line, the output electrode of the first switching transistor connected to the control electrodes of first and second driving transistors, the output electrode of the second switching transistor connected to the input electrode of the first driving transistor, the first and second driving transistors having their output electrodes connected to a light-emitting diode, wherein a capacitor, connected between the control electrode of the driving transistors and the driving voltage line, when charged through the first switching transistor to the threshold voltage of the second driving transistor, turns on the second driving transistor to apply the driving voltage to the light emitting diode.

BRIEF DESCRIPTION OF THE DRAWING

The foregoing and other objects and features of the present invention will become more apparent from the ensuing description when read together with the accompanying drawings, in which.

DETAILED DESCRIPTION OF THE EMBODIMENTS

Figure 1:
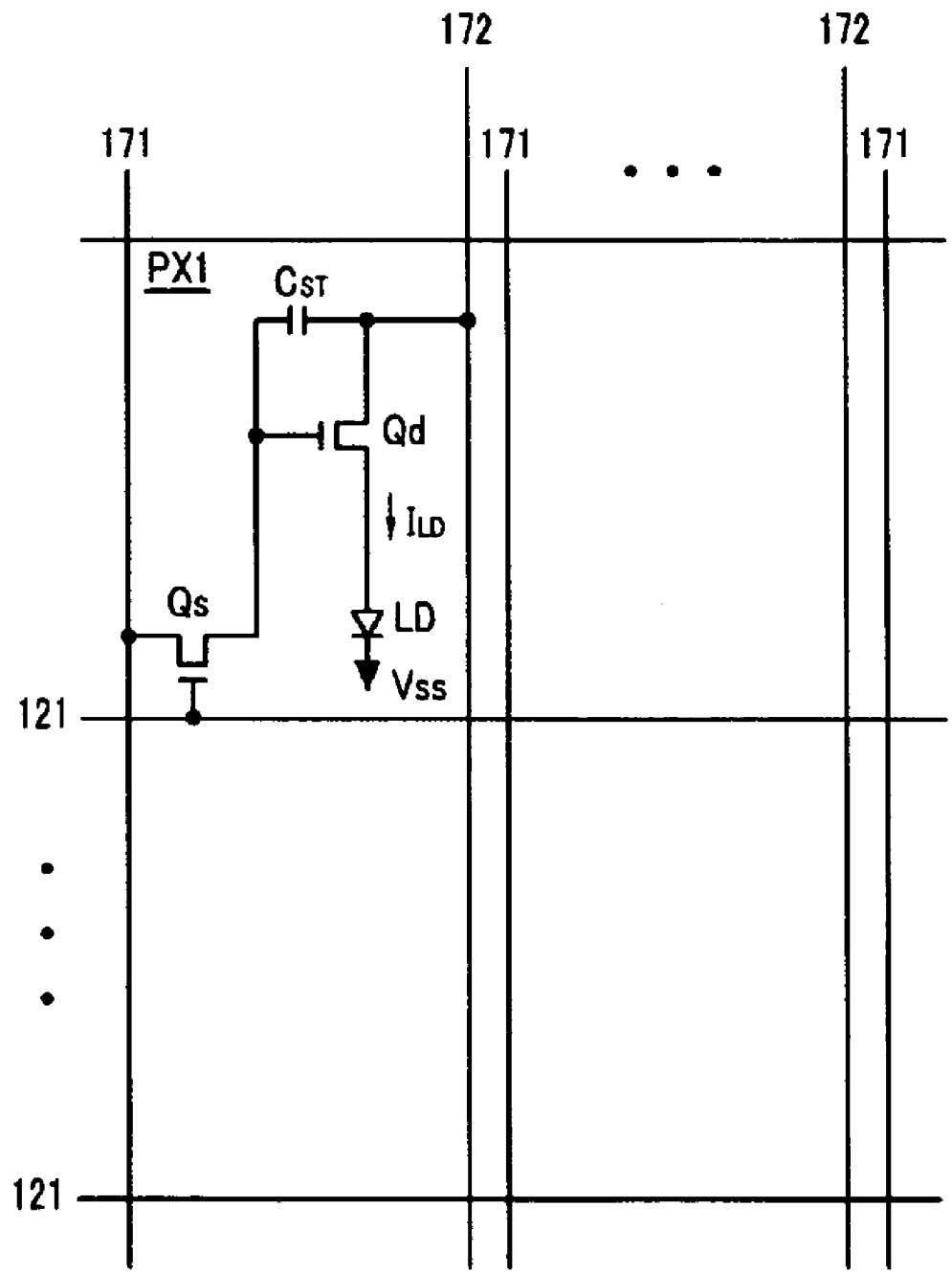
FIG. 1 is an equivalent circuit diagram of an OLED display according to an exemplary embodiment of the present invention.

In the drawings, the thickness of layers, films, panels, regions, etc., are exaggerated for clarity. Like reference numerals designate like elements throughout the specification. It will be understood that when an element such as a layer, film, region or substrate is referred to as being "on" another element, it can be directly on the other element or intervening elements may also be present. In contrast, when an element is referred to as being "directly on" another element, there are no intervening elements present.

Referring to FIG. 1, an OLED display according to an embodiment of the present invention includes a plurality of signal lines 121, 171, and 172 and a plurality of pixels PX1 connected thereto and arranged substantially in a matrix.

The signal lines include a plurality of gate lines 121 for transmitting gate signals (or scanning signals), a plurality of data lines 171 for transmitting data signals, and a plurality of driving voltage lines 172 for transmitting a driving voltage. Gate lines 121 extend substantially in a row direction and substantially parallel to each other, while data lines 171 and the driving voltage lines 172 extend substantially in a column direction and substantially parallel to each other.

Each pixel PX1 includes a switching transistor Qs, a driving transistor Qd, a capacitor $C_{ST}$, and an OLED LD. Switching transistor Qs has a control terminal connected to one of gate lines 121, an input terminal connected to one of data lines 171, and an output terminal connected to the driving transistor Qd. Switching transistor Qs transmits the data signals applied to data line 171 to the driving transistor Qd in response to the gate signal applied to the gate line 121.

Driving transistor Qd has a control terminal connected to the switching transistor Qs, an input terminal connected to the driving signal line 172, and an output terminal connected to the OLED LD. Driving transistor Qd provides an output current $I_{LD}$ having a magnitude depending on the voltage between the control terminal and the output terminal thereof.

Capacitor $C_{ST}$ is connected between the control terminal and the output terminal of driving transistor Qd. Capacitor $C_{ST}$ stores the data signal applied to the control terminal of the driving transistor Qd and maintains the data signal after the switching transistor Qs turns off.

The OLED LD has an anode connected to the output terminal of the driving transistor Qd and a cathode connected to common voltage Vss. The OLED LD emits light having an intensity depending on the output current $I_{LD}$ supplied by driving transistor Qd.

Switching transistor Qs and driving transistor Qd are n-channel field effect transistors (FETs). However, at least one of the switching transistor Qs and the driving transistor Qd may be a p-channel FET. In addition, the connections among the transistors Qs and Qd, the capacitor $C_{ST}$, and the OLED LD may be modified.

Figure 2:
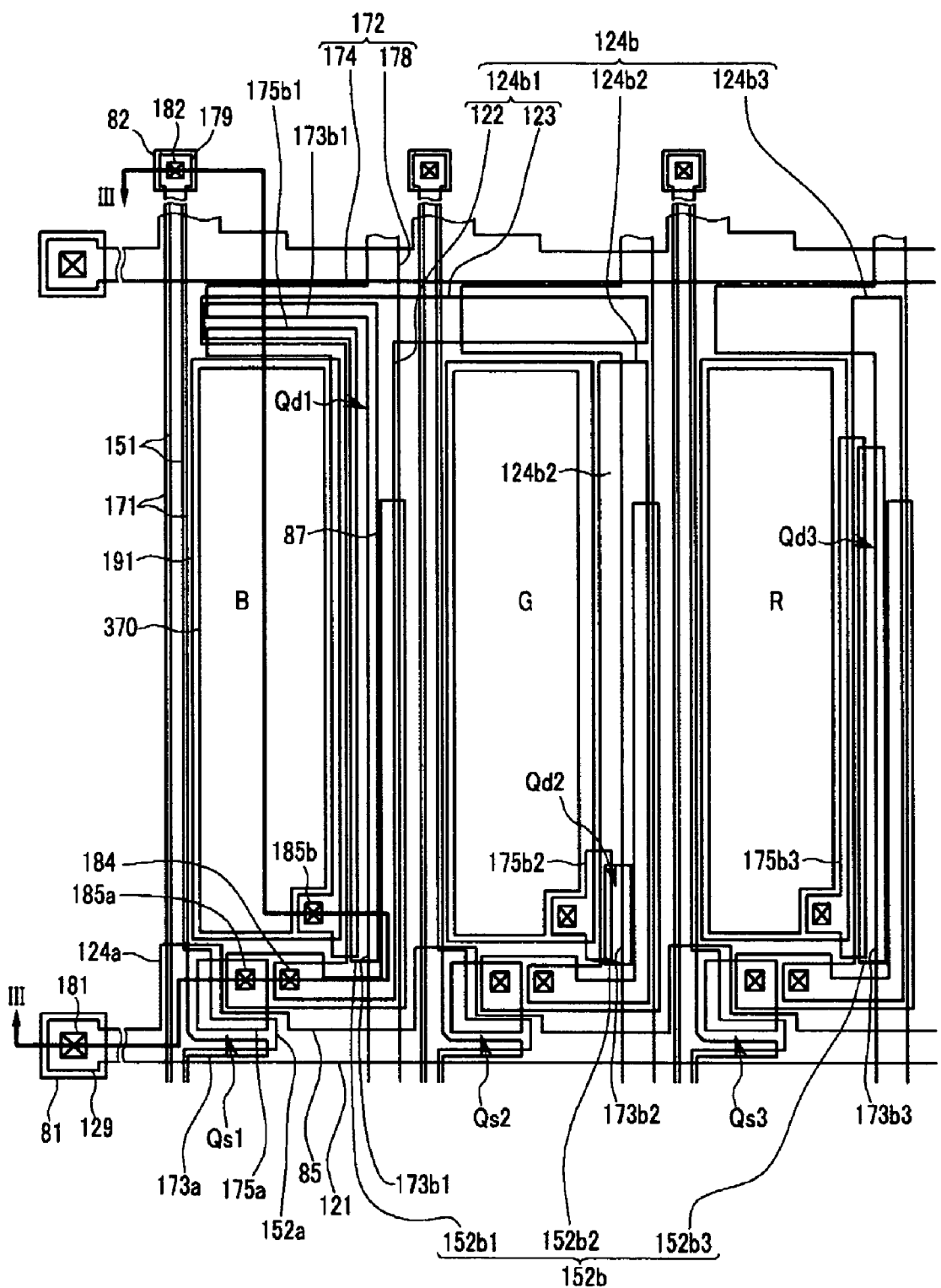
FIG. 2 is a layout view illustrating three adjacent pixels of an OLED display according to an exemplary embodiment of the present invention.
Figure 3:
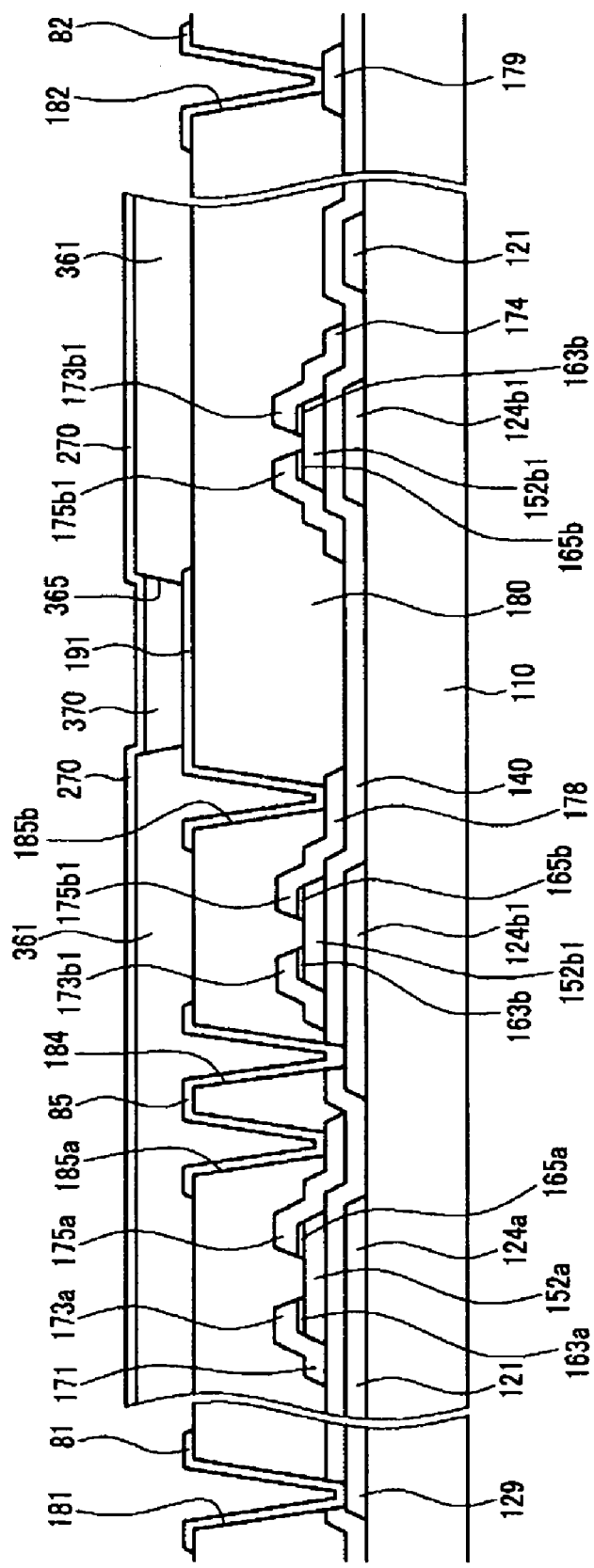
FIG. 3 is a sectional view of the OLED display shown in FIG. 2 taken along the lines III-II.

Referring to FIGS. 2 and 3, the detailed structure of the OLED display shown in FIG. 1 according to an exemplary embodiment of the present invention will be described in detail. FIG. 2 is a layout view illustrating three adjacent pixels of an OLED display according to an exemplary embodiment of the present invention, and FIG. 3 is a sectional view of the OLED display shown in FIG. 2 taken along the lines III-III. The three adjacent pixels represent blue, red, and green, colors, respectively, and are denoted as reference characters B, R, and G, respectively. It is assumed that the luminous efficiency increases in the order of the blue, green, and red pixels B, R, and R.

A plurality of gate conductors that include a plurality of gate lines 121 including a plurality of first control electrodes 124a and a plurality of second control electrodes 124b are formed on an insulating substrate 110 made of a material such as transparent glass or plastic.

Gate lines 121 for transmitting gate signals extend substantially in a transverse direction. Each gate line 121 further includes an end portion 129 having a large area for contact with another layer or an external driving circuit, and the first control electrodes 124a protruding upward from the gate line 121. Gate lines 121 may extend to be directly connected to a gate driving circuit (not shown) for generating the gate signals, which may be integrated on the substrate 110.

Second control electrodes 124b are separated from gate lines 121 and have sizes and shapes that are different from each other in the three pixels B, G, and R. For example, the second control electrode 124b1 of the blue pixel B has a larger size than that of the second control electrodes 124b2 and 124b3 of the green and red pixels G and R. Each of the second control electrodes 124b1 of the blue pixels B includes a horizontal portion 123 that is substantially parallel to gate lines 121 and a vertical portion 122 extending substantially in a longitudinal direction and substantially perpendicular to the horizontal portion 123, and portions of the horizontal portion 123 extend to an adjacent green pixel G.

Second control electrodes 124b2 and 124b3 may have a bar shape extending substantially parallel to the vertical portions 122. However, second control electrodes 124b1, 124b2, and 124b3 may have various shapes and sizes depending to channel widths of driving transistors Qd1, Qd2, and Qd3.

Gate conductors 121 and 124b are preferably made of an Al-containing metal such as Al and an Al alloy, a Ag-containing metal such as Ag and a Ag alloy, a Cu-containing metal such as Cu and a Cu alloy, a Mo-containing metal such as Mo and a Mo alloy, Cr, Ta, Ti, etc. Gate conductors 121 and 124b may have a multi-layered structure including two films having different physical characteristics. One of the two films is preferably made of a low resistivity metal including an Al-containing metal, an Ag-containing metal, and a Cu-containing metal for reducing signal delay or voltage drop. The other film is preferably made of a material such as a Mo-containing metal, Cr, Ta, or Ti, which has good physical, chemical, and electrical contact characteristics with other materials such as indium tin oxide (ITO) or indium zinc oxide (IZO). Good examples of the combination are a lower Cr film and an upper Al (alloy) film and a lower Al (alloy) film and an upper Mo (alloy) film. However, gate conductors 121 and 124b may be made of other various metals or conductors.

The lateral sides of gate conductors 121 and 124b are inclined relative to the surface of substrate 110; the inclination angle thereof ranging from about 30 to 80 degrees. A gate insulating layer 140 preferably made of silicon nitride (SiNx) or silicon oxide (SiOx) is formed on gate conductors 121 and 124b.

A plurality of semiconductor stripes and islands 151 and 152b preferably made of hydrogenated amorphous silicon (abbreviated to "a-Si") or polysilicon are formed on the gate insulating layer 140. Each of the semiconductor stripes 151 extends substantially in the longitudinal direction and includes a plurality of projections 152a branched out toward the first control electrodes 124a. The semiconductor islands 152b are disposed on the second control electrodes 124b.

Semiconductor islands 152b have sizes and shapes that are different from each other in the three pixels B, G, and R. The semiconductor islands 152b1 of the blue pixels B are formed like a character "⊤" and have the largest size. Each of the semiconductor islands 152b2 and 152b3 of the green and red pixels G and R has a length that is less than that of the semiconductor island 152b1, or a bar shape. However, the semiconductors 151, 152b1, 152b2, and 152b3 may have various shapes and sizes depending to channel widths of the driving transistors Qd1, Qd2, and Qd3.

A plurality of pairs of first ohmic contact islands 163a and 165a and a plurality of pairs of second ohmic contact islands 163b and 165b are formed on the semiconductor stripes and islands 151 and 152b, respectively. Ohmic contacts 163a, 163b, 165a, and 165b are preferably made of silicide or n+ hydrogenated a-Si heavily doped with an n-type impurity such as phosphorous. The first ohmic contacts 163a and 165a are located in pairs on the semiconductor stripes 151, and the second ohmic contacts 163b and 165b are located in pairs on the semiconductor islands 152b.

A plurality of data conductors including a plurality of data lines 171, a plurality of driving voltage lines 172, and a plurality of first and second output electrodes 175a and 175b are formed on the ohmic contact islands 163a, 163b, 165b, and 165b and the gate insulating layer 140.

Data lines 171 for transmitting data signals extend substantially in the longitudinal direction and intersect gate lines 121. Each data line 171 includes a plurality of first input electrodes 173a extending toward the first control electrodes 124a and an end portion 179 having a large area for contact with another layer or an external driving circuit. Data lines 171 may extend to be directly connected to a data driving circuit (not shown) for generating the data signals, which may be integrated on the substrate 110. Data lines 171 disposed between the blue and green pixels B and G intersect the second control electrode 124b1 of the blue pixels B.

The driving voltage lines 172 for transmitting driving voltages intersect gate lines 121. Each driving voltage line 172 includes a linear portion 178 extending substantially in the longitudinal direction and a plurality of projections 174 projecting from the linear portion 178. In addition, portions of driving voltage lines 172 function as second input electrodes 173b of which at least one portion thereof overlaps the second control electrodes 124b. The second input electrodes 173b1 of the blue pixels B are formed between the linear portion 178 and the projections 174, and the second input electrodes 173b2 and 173b3 are formed on portions of the linear portions 178. The horizontal portions 123 of the second control electrodes 124b1 overlap the projections 174 of the driving voltage lines 172 in the green pixels G.

The second output electrodes 175b1, 175b2, and 175b3 in the three pixels B, G, and R have sizes and shapes that are different from each other, and the second output electrodes 175b1 of the blue pixels B are formed like the character "⊤" and have the largest size. Meanwhile, each of the second output electrodes 175b2 and 175b3 of the remaining two pixels G and R has a length that is less than that of the second output electrode 175b1, or a bar-shape. However, the second output electrodes 175b1, 175b2, and 175b3 may have various shapes and sizes depending to channel widths of driving transistors Qd1, Qd2, and Qd3.

The first and second output electrodes 175a and 175b are separated from each other and from data lines 171 and the driving voltage lines 172. Each pair of the first input electrodes 173a and the first output electrodes 175a are disposed opposite each other with respect to a first control electrode 124a, and each pair of the second input electrodes 173b and the second output electrodes 175b are disposed opposite each other with respect to a second control electrode 124b.

Data conductors 171, 172, 175a, and 175b are preferably made of a refractory metal including Mo, Cr, Ta, Ti, or alloys thereof. They may have a multi-layered structure preferably including a refractory metal film and a low resistivity film. Good examples of the multi-layered structure are a double-layered structure including a lower Cr film and an upper Al (alloy) film, a double-layered structure of a lower Mo (alloy) film and an upper Al (alloy) film, and a triple-layered structure of a lower Mo (alloy) film, an intermediate Al (alloy) film, and an upper Mo (alloy) film. However, the data conductors 171, 172, 175a, and 175b may be made of other various metals or conductors.

Like gate conductors 121 and 124b, data conductors 171, 172, 175a, and 175b have inclined edge profiles, and the inclination angles thereof range from about 30 to 80 degrees.

Ohmic contacts 163a, 163b, 165b, and 165b are interposed only between the underlying semiconductors 152a and 152b and the overlying data conductors 171, 172, 175a, and 175b and reduce the contact resistance therebetween. Semiconductors 152a and 152b include a plurality of exposed portions, which are not covered with the data conductors 171, 172, 175a, and 175b, such as portions disposed between the input electrodes 173a and 173b and the output electrodes 175a and 175b.

A passivation layer 180 is formed on data conductors 171, 172, 175a, and 175b and the exposed portions of semiconductors 152a and 152b. Passivation layer 180 is preferably made of an inorganic or organic insulator, and may have a flat top surface. Examples of inorganic insulators include silicon nitride and silicon oxide. The organic insulator may have photosensitivity and a dielectric constant of less than about 4.0. Passivation layer 180 may include a lower film of an inorganic insulator and an upper film of organic insulator such that it takes the excellent insulating characteristics of the organic insulator while preventing the exposed portions of the semiconductor islands 152a and 152b from being damaged by the organic insulator.

Passivation layer 180 has a plurality of contact holes 182, 185a, and 185b exposing the end portions 179 of data lines 171, the first output electrodes 175a, and the second output electrodes 175b, respectively, and the passivation layer 180 and the gate insulating layer 140 have a plurality of contact holes 181 and 184 exposing the end portions 129 of gate lines 121 and the second control electrodes 124b, respectively.

A plurality of pixel electrodes 191, a plurality of connecting members 85, and a plurality of contact assistants 81 and 82 are formed on passivation layer 180 and are preferably made of a transparent conductor such as ITO or IZO or a reflective conductor such as Al, Ag, or alloys thereof.

Pixel electrodes 191 are connected to the second output electrodes 175b through contact holes 185b.

Connecting members 85 are connected to the second control electrodes 124b and the first output electrodes 175a through the contact holes 184 and 185b, respectively. Each of connecting members 85 includes a storage electrode 87 extending to and overlapping along the driving voltage line 172.

Contact assistants 81 and 82 are connected to the end portions 129 of gate lines 121 and the end portions 179 of data lines 171 through the contact holes 181 and 182, respectively. The contact assistants 81 and 82 protect the end portions 129 and 179 and enhance the adhesion between the end portions 129 and 179 and external devices.

A partition 361 is formed on the passivation layer 180. The partition 361 surrounds the pixel electrodes 191 like a bank to define openings 365, and it is preferably made of an organic or inorganic insulating material. The partition 361 may be made of a photosensitive material containing a black pigment so that the black partition 361 may serve as a light blocking member and the formation thereof may be simplified.

A plurality of organic light-emitting members 370 are formed on the pixel electrodes 191 and confined in the openings 365 defined by the partition 361. Each of the organic light-emitting members 370 of the blue pixels B includes one side adjacent to the horizontal portions 123 of the second control electrodes 124b1 and another side adjacent to the vertical portions 122 of the second control electrodes 124b1.

Each of the organic light-emitting members 370 is preferably made of an organic material uniquely emitting one of primary color lights such as red, green, and blue light. The OLED display displays images by spatially adding the monochromatic primary color light emitted from the organic light-emitting members 370.

Each of the light-emitting members 370 may have a multi-layered structure including an emitting layer (not shown) for emitting light and auxiliary layers (not shown) for improving the luminous efficiency of the emitting layer. The auxiliary layers may include an electron transport layer (not shown) and a hole transport layer (not shown) for improving the balance of the electrons and holes, and an electron injecting layer (not shown) and a hole injecting layer (not shown) for improving the injection of the electrons and holes.

A common electrode 270 is formed on the organic light-emitting members 370 and the partition 361. A common electrode 270 is supplied with the common voltage Vss, and is preferably made of a reflective metal such as Ca, Ba, Mg, Al, Ag, etc., or a transparent material such as ITO and IZO.

In the above-described OLED display, a first control electrode 124a connected to a gate line 121, a first input electrode 173a connected to a data line 171, and a first output electrode 175a along with a projection 152a of a semiconductor stripe 151 form a switching TFT Qs having a channel formed in the projection 152a disposed between the first input electrode 173a and the first output electrode 175a. Likewise, a second control electrode 124b connected to a first output electrode 175a, a second input electrode 173b connected to a driving voltage line 172, and a second output electrode 175b connected to a pixel electrode 191 along with a semiconductor island 152b form a driving TFT Qd having a channel formed in the semiconductor island 152b disposed between the second source electrode 173b and the second drain electrode 175b. A pixel electrode 191, a light-emitting member 370, and the common electrode 270 form an OLED LD having the pixel electrode 191 as an anode and the common electrode 270 as a cathode, or vice versa.

The OLED display emits the light toward the top or bottom of the substrate 110 to display images. A combination of opaque pixel electrodes 191 and a transparent common electrode 270 is employed in a top emission OLED display that emits light toward the top of the substrate 110, and a combination of transparent pixel electrodes 191 and an opaque common electrode 270 is employed in a bottom emission OLED display that emits light toward the bottom of the substrate 110.

Semiconductors 151 and 152b, if made of polysilicon, may include intrinsic regions (not shown) disposed under the gate electrodes 124a and 124b and extrinsic regions (not shown) disposed opposite each other with respect to the intrinsic regions. The extrinsic regions are electrically connected to the input electrodes 173a and 173b and the output electrodes 175a and 175b, and the ohmic contacts 163a, 163b, 165a, and 165b may be omitted.

Gate electrodes 124a and 124b may be disposed over the semiconductors 152a and 152b, while the gate insulating layer 140 is still interposed between the semiconductors 152a and 152b and the gate electrodes 124a and 124b. At this time, the data conductors 171, 172, 173b, and 175b may be disposed on the gate insulating layer 140 and electrically connected to the semiconductors 151 and 152b through the contact holes (not shown) in the gate insulating layer 140. Otherwise, the data conductors 171, 172, 173b, and 175b may be disposed under the semiconductors 151 and 152b and may electrically contact the semiconductors 151 and 152b.

The overlapping portions of a second control electrode 124b and a driving voltage line 172 form a storage capacitor $C_{ST}$, and the voltage storing capacity of the storage capacitor $C_{ST}$ is enhanced by overlapping the driving voltage 172 and a storage electrode 87.

As described above, the OLED is driven by maintaining a voltage on a storage capacitor connecting the anode electrode of each pixel to a driving transistor. In particular, the data voltage applied through a data line charges the storage capacitor through a switching transistor when a gate-on voltage is applied to a gate line. After the voltage is changed from the gate-on voltage to a gate-off voltage, the charged voltage on the storage capacitor functions as the gate voltage of a driving transistor. A current determined by the difference between the gate voltage and the driving voltage applied to a driving voltage line flows through the driving transistor.

In order to obtain a current having a desired magnitude, it is desired to reduce the kickback voltage between the control electrode and an output electrode of the switching transistor when the gate-on voltage is changed to the gate-off voltage. The kickback voltage is calculated by the equation below. In the equation, the capacitors $C_{LC}$, $C_{ST}$, and Cgd and their capacitances are respectively denoted as the same reference characters.

$$Vk = \frac{Cgd}{C_{LC} + C_{ST} + Cgd}\Delta Vg$$

Here, $C_{LC}$ is capacitance of the liquid crystal capacitor, $C_{ST}$ is capacitance of the storage capacitor, Cgd is the parasitic capacitance between an input electrode and an output electrode of the switching transistor, and $\Delta Vg$ is a voltage difference between a gate-on voltage and a gate-off voltage Voff.

As shown in the equation, to reduce the kickback voltage, the capacitance $C_{ST}$ of the storage capacitor should be increased.

In the embodiment of the present invention, it is possible to reduce the kickback voltage and improve the magnitude of an output current from a driving transistor and luminance of the pixel by increasing the capacitance of a storage capacitor in a pixel having low luminous efficiency.

In the OLED display according to embodiment of the present invention, the channel widths of the driving transistors Qd1, Qd2, and Qd3 with respect to each of the blue, green, and red pixels B, G, and R are different from each other, and the channel widths are varied in accordance with the luminous efficiency of the OLEDs LD. The luminous efficiency of the OLED LD is based on a light-emitting material, for example, the luminous efficiency decrease in order of green, red, and blue pixels G, R, and B in sequence. Since an output current should be increased as the luminous efficiency is reduced in order to obtain the same brightness with respect to the same data voltage, the channel width of the driving transistor is required to be increased.

Since the blue pixel B having the lowest luminous efficiency has the largest channel width of the driving transistor Qd1 of three pixels B, G, and R, the driving transistor Qd1 for the blue pixel B is formed on the upper portions as well as the side portions of the OLED LD, while the remaining driving transistors Qd2 and Qd3 for the green and red pixels G and R are only formed on the side portions of the OLEDs LD.

In order to obtain uniform color combination, the areas of the OLEDs LD of the three pixels B, G, and R should be the same as each other. Therefore, predetermined spaces are formed in the upper areas of the OLEDs LD, on which the driving transistors Qd2 and Qd3 are not formed, except for the blue pixel B.

Thereby, the second control electrode 124b1 of the green pixel B extends to the predetermined space of the next adjacent green pixel G to increase the area of the storage capacitor of the blue pixel B. That is, the second control electrode 124b1 of the blue pixel B that has the lowest luminous efficiency overlaps the driving voltage line 172 of the adjacent green pixel G as well as a driving voltage line 172 of the blue pixel B, to improve the capacitance of the storage capacitor of the blue pixel B as compared with the green pixel G which has a greater luminous efficiency.

By increasing the capacitance of the storage capacitor of the pixel B having a low luminous efficiency compared with neighboring pixels, the kickback voltage of the driving transistor Qd1 decreases, thereby preventing a reduction in the current applied to the OLED LD of pixel B. Accordingly, a decrease in the luminance of the blue pixel B is also prevented.

In the above, the luminous efficiency decreases in the order of green, red, and blue pixels G, R, and B, but the order may be varied based on light-emitting material in which case the present invention may still be employed.

Figure 4:
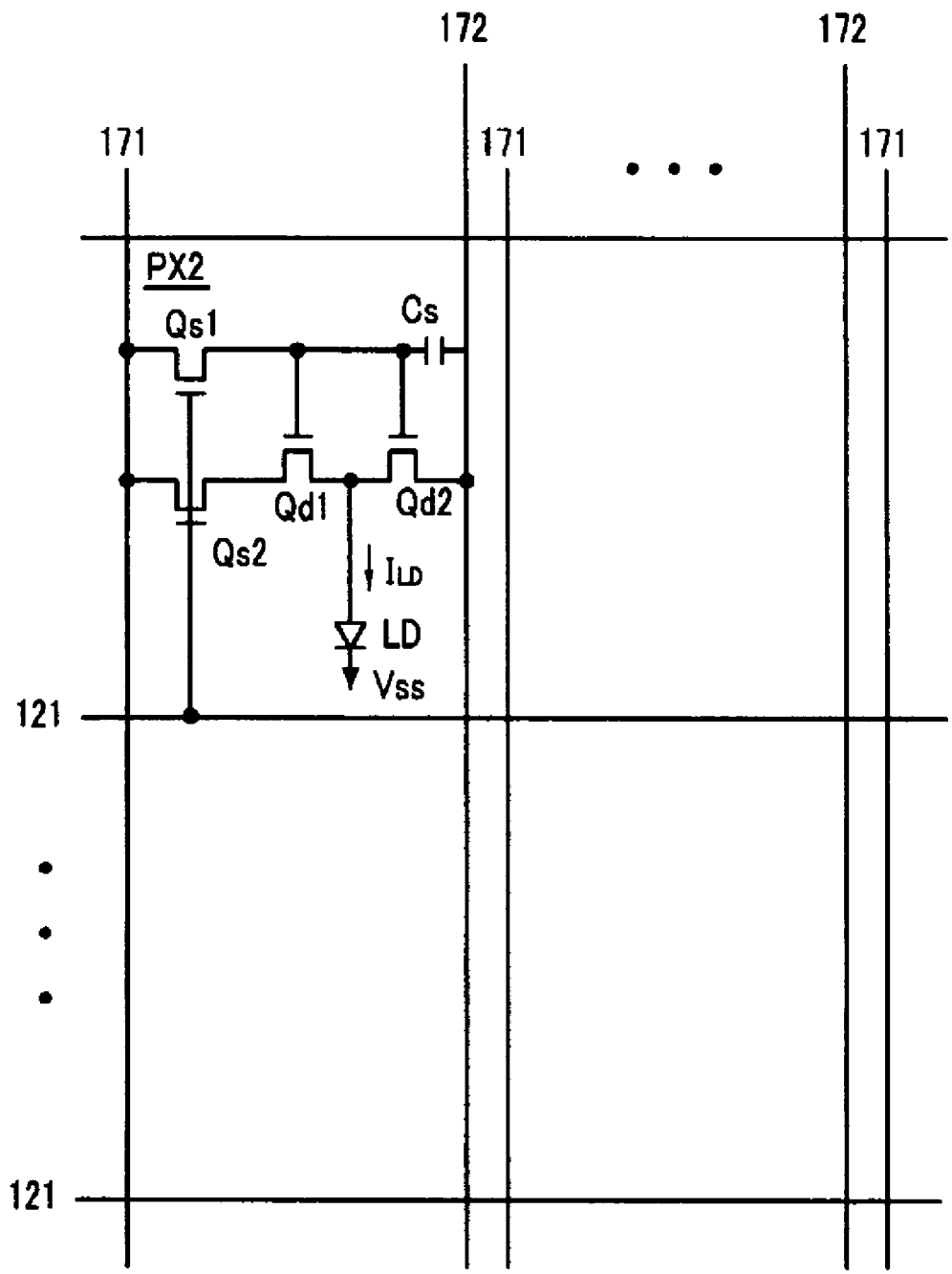
FIG. 4 is an equivalent circuit diagram of an OLED display according to another exemplary embodiment of the present invention.

Next, an OLED display according to another exemplary embodiment of the present invention will be described with reference to FIG. 4 which compensates for the variation of data voltages due to the variation of the threshold voltages of the driving transistors. Referring to the equivalent circuit shown in FIG. 4, an OLED display includes a plurality of signal lines 121, 171, and 172, and a plurality of pixels PX2 connected thereto and arranged substantially in a matrix.

The signal lines include a plurality of gate lines 121, a plurality of data lines 171, and a plurality of driving voltage lines 172. Each pixel PX2 includes first and second driving transistors Qd1 and Qd2, first and second switching transistors Qs1 and Qs2, a storage capacitor Cs, and an OLED LD.

The first driving transistor Qd1 has a control terminal connected to the first switching transistor Qs1, an input terminal connected to the second switching transistor Qs2, and an output terminal connected to the OLED LD.

The second driving transistor Qd2 has a control terminal connected to the first switching transistor Qs1, an input terminal connected to the driving voltage line 172, and an output terminal connected to the OLED LD. The second driving transistor Qd2 drives an output current $I_{LD}$ having a magnitude depending on the voltage between the control terminal and the output terminal thereof.

The first and second switching transistors Qs1 and Qs2 have control terminals connected to the gate line 121, input terminals connected to data line 171, and output terminals connected to the control terminal of first and second driving transistors Qd1 and Qd2 and the input terminal of the first driving transistor Qd1, respectively. The first and second switching transistors Qs1 and Qs2 transmit the data signals applied to data line 171 to the first and second driving transistors Qd1 and Qd2 in response to the gate signal applied to the gate line 121, respectively.

The capacitor Cs is connected between the control terminals of the driving transistors Qd1 and Qd2 and the driving voltage line 172. The capacitor $C_{ST}$ stores the data signal applied to the control terminal of the first and second driving transistors Qd1 and Qd2 and maintains the data signal after the first switching transistor Qs1 turns off.

The OLED LD has an anode connected to the output terminal of the first and second driving transistors Qd1 and Qd2 and a cathode connected to a common voltage Vss. The OLED LD emits light having an intensity depending on an output current $I_{LD}$ of the first and second driving transistors Qd1 and Qd2, thereby displaying images.

Next, the operation of pixel PX2 will be described in detail. Each pixel PX2 is operated in a normal mode and a compensation mode, respectively. In the normal mode pixel PX2 normally displays images, while in the compensation mode pixel PX2 compensates for the variation of data voltages due to the variation of the threshold voltages of the driving transistors Qd1 and Qd2.

The data signals applied to pixel PX2 are the data voltages in the normal mode and data currents in the compensation mode. For applying the data voltages and the data currents, the OLED according to the embodiment of the present invention may include a driving unit (not shown) connected to data lines 171 for generating the data voltages and the data currents.

In the normal mode, the operations of pixel PX2 are substantially the same as those of the pixel PX1 shown in FIG. 1. That is, when the first switching transistor Qs1 is turned-on by a scanning signal, the data voltage applied to data line 171 is applied to the control terminal of the second driving transistor Qd2 through the first switching transistor Qs1, and the second driving transistor Qd2 outputs an output current $I_{LD}$ based on the data voltage to the OLED LD. Thereby the OLED LD emits light based on the current $I_{LD}$ to display images.

At the same time as the first switching transistor Qs1 is turned on the second switching transistor Qs2 is also turned on by the scanning signal. Thereby the data voltage is applied to the control terminal and the input terminal of the first driving transistor Qd1 through the first and second switching transistors Qs1 and Qs2, respectively. Accordingly, although the first driving transistor Qd1 is turned on, the voltages applied to its input and control terminals are substantially equal to each other so that no current flow through first driving transistor Qd1. As a result, in the normal mode, an image corresponding to the data voltage is displayed because of the conductive path established through first switching transistor Qs1 and second driving transistor Qd2.

To obtain uniform luminance of the OLED LD it is required that a uniform current $I_{LD}$ flow through the second driving transistor Qd2. However, when the threshold voltage of the second driving transistor Qd2 is varied, even though a uniform data voltage is applied to the control terminal of the second driving transistor Qd2, the current $I_{LD}$ flowing through the second driving transistor Qd2 is not uniform. Thereby, compensation of the data voltage is required in accordance with the variation of the threshold voltage of the second driving transistor Qd2. In the compensation mode, compensation of the data voltage is performed.

In the compensation mode, the driving unit (not shown), acting as a constant current source, applies a data current having a predetermined constant magnitude to data line 171. Then, when the first and second switching transistors Qs1 and Qs2 are turned on by the scanning signal, the data current begins to charge storage capacitor Cs through the first switching transistor Qs1. The current that flows through the first driving transistor Qd1, however, depends on the state of charge of capacitor Cs. As the charge on capacitor Cs increases the current flowing through the first driving transistor Qd1 increases. The storage capacitor Cs continues to charge until the input current to the first driving transistor Qd1 through the first switching transistor Qs1 becomes substantially equal to the output current of the first driving transistor Qd1. The charged voltage (hereinafter, referred to as "compensation voltage") has a one-to-one correspondence with the data current, the variation amount of the threshold voltage of the first driving transistor Qd1 is established as the compensation voltage.

The control terminals of driving transistors Qd1 and Qd2 are connected to each other, and the same voltage is applied to the control terminals thereof. In addition, the output terminals of the driving transistors Qd1 and Qd2 are connected to each other and output the same voltage.

The variation of each of the threshold voltages of the first and second driving transistors Qd1 and Qd2 relies on the difference between the control terminals and the output terminals of the first and second driving transistors Qd1 and Qd2 regardless of the width/length of the channels of the driving transistors. Since transistors Qd1 and Qd2 both have control terminals connected to each other, as well as output terminals connected to each other, the variation amount of the threshold voltages of the driving transistors Qd1 and Qd2 is substantially the same. Thereby, a compensation voltage with respect to the first driving transistor Qd1 may be employed in the second driving transistor Qd2.

Therefore, in compensation mode, a compensation voltage with respect to a data current having a predetermined constant magnitude is stored in a storing unit such as a look-up table (not shown).

Then, in the normal mode, the data voltage is compensated referring to the compensation voltage stored in the storing unit to apply the compensated data voltage to the second driving transistor Qd2. Thereby, even though the threshold voltage of the second driving transistor Qd2 is varied, the output current $I_{LD}$ flowing through the second driving transistor Qd2 is uniform to obtain uniform luminance of the OLED LD.

The threshold voltage of the second driving transistor Qd2 is varied for a long time such that the compensation mode with respect to each pixel PX2 takes long time.

Even though the operation mode of a pixel PX2 is changed from the normal mode for displaying images to the compensation mode, the compensation mode does not influence the displayed images.

Next, a layout view of the OLED shown in FIG. 4 will be described in detail with reference to FIGS. 5 and 6. As compared with FIGS. 2 and 3, elements performing the same operations are indicated with the same reference numerals, and detailed description thereof is omitted.

Figure 5:
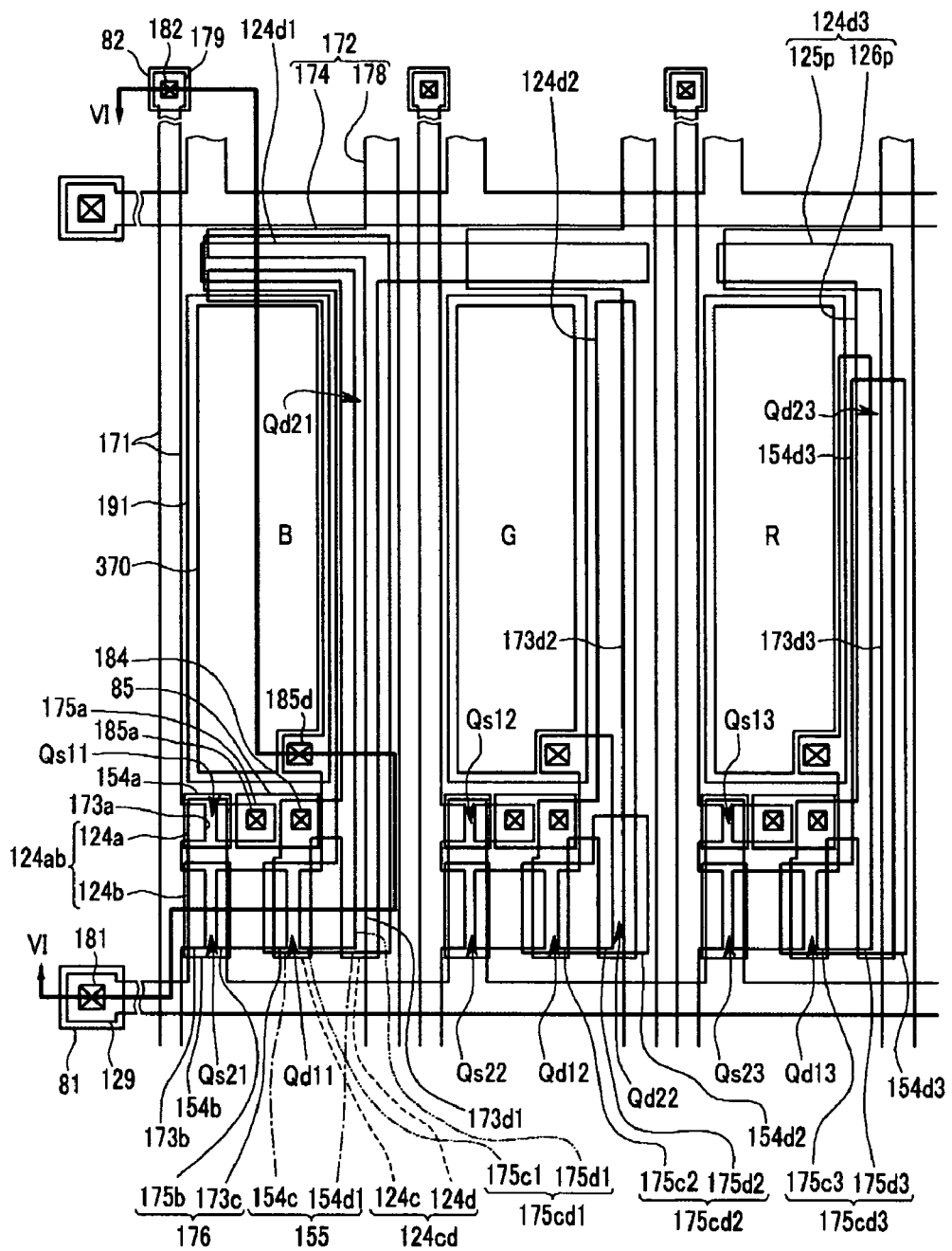
FIG. 5 is a layout view illustrating three adjacent pixels of an OLED display according to another exemplary embodiment of the present invention.
Figure 6:
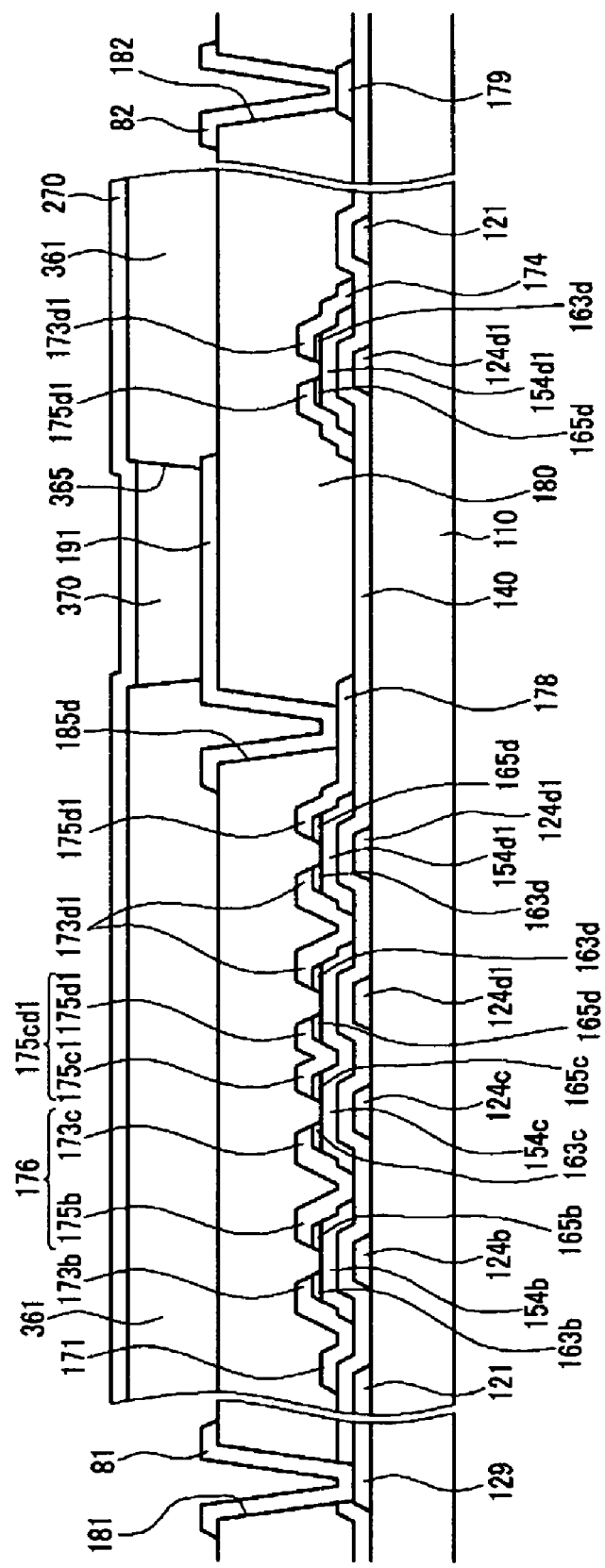
FIG. 6 is a sectional view of the OLED display shown in FIG. 5 taken along the lines VI-VI.

FIG. 5 is a layout view illustrating three adjacent pixels of an OLED display according to another exemplary embodiment of the present invention, and FIG. 6 is a sectional view of the OLED display shown in FIG. 5 taken along the lines VI-VI.

A plurality of gate conductors that include a plurality of gate lines 121 including first electrode members 124ab and a plurality of second electrode members 124cd are formed on an insulating substrate 110.

Gate lines 121 extend substantially in a transverse direction. Each gate line 121 further includes an end portion 129 having a large area for contact with another layer or an external driving circuit. Each of the first electrode members 124ab includes first and second control electrodes 124a and 124b protruding upward from the gate line 121.

The second electrode members 124cd are separated from gate lines 121. Each of the second electrode members 124cd includes third and fourth control electrodes 124c and 124d.

The fourth control electrodes 124d of the blue, green, and red pixels B, G, and R are denoted as 124d1, 124d2, and 124d3, respectively. The fourth control electrodes 124d1, 124d2, and 124d3 have sizes and shapes that are different from each other in the three pixels B, G, and R. Each of the fourth control electrodes 124d1 of the blue pixels B includes a horizontal portion extending to the adjacent green pixels G and a vertical portion substantially perpendicular to the horizontal portion. The fourth control electrodes 124d2 and 124d4 of the green and red pixels G and R include only vertical portions, respectively. However, the fourth control electrodes 124d1, 124d2, and 124d3 may have various shapes and sizes depending on channel widths of second driving transistors.

A gate insulating layer 140 is formed on gate conductors 121, 124ab, and 124cd.

A plurality of first, second, third and fourth semiconductor islands 154a-154c, and 154d are formed on the gate insulating layer 140. The fourth semiconductor islands 154d of the blue, green, and red pixels B, G, and R are denoted as 154d1, 154d2, and 154d3, respectively.

The first and second semiconductor islands 154a and 154b are disposed on the first and second control electrodes 124a and 124b, respectively, and one pattern 155 including the third and fourth semiconductor islands 154c and 154d1 is disposed on the respective second electrode members 124cd.

The fourth semiconductor islands 154d have sizes and shapes that are different from each other in the three pixels B, G, and R. The fourth semiconductor islands 154d1 of the blue pixels B are formed like a character "⊓" and have the largest size of the three pixels B, G, and R. Each of the fourth semiconductor islands 154d2 and 154d3 of the two remaining green and red pixels G and R has a length that is less than that of the fourth semiconductor island 154d1, or a bar-shape. However, the semiconductor islands 154a-154d1, 154d2, and 154d3 may have various shapes and sizes depending to channel widths of the second driving transistors.

A plurality of pairs of first ohmic contact islands (not shown), a plurality of pairs of second ohmic contact islands 163b and 165b, a plurality of pairs of third ohmic contact islands 163c and 165c, and a plurality of pairs of third ohmic contact islands 163d and 165d are formed on the semiconductor islands 154a-154d, respectively. The first ohmic contacts are located in pairs on the semiconductor islands 154a, the second ohmic contacts 163b and 165b are located in pairs on the semiconductor islands 154b, the third ohmic contacts 163c and 165c are located in pairs on the semiconductor islands 154c, and the fourth ohmic contacts 163d and 165d are located in pairs on the semiconductor islands 154d.

A plurality of data conductors including a plurality of data lines 171, output electrodes 175a, third electrode members 176, fourth electrode members 175cd, and a plurality of driving voltage lines 172 are formed on the ohmic contact islands 163b-163d and 165b-165d and the gate insulating layer 140.

Data lines 171 extend substantially in the longitudinal direction and intersect gate lines 121. Each data line 171 includes a plurality of first and second input electrodes 173a and 173b extending toward the first and second control electrodes 124a and 124b and an end portion 179 having a large area. The first input electrodes 173a overlap portions of the first semiconductor islands 154a, and the second input electrodes 173b overlap portions of the second semiconductor islands 154b. Data lines 171 disposed between the blue and green pixels B and G intersect the fourth control electrode 124d1 of the blue pixels B.

The first output electrodes 175a separate from data lines 171 and are opposite to the first input electrodes 173a with respect to the first semiconductor islands 154a.

The third electrode members 176 separate from data lines 171. One side of each third electrode member 176 functions as the second output electrode 175b opposite to the second input electrode 173b with respect to the semiconductor island 154b, and the other side of each third electrode member 176 functions as the third input electrode 173c of which portions overlap the semiconductor island 154c.

The fourth electrode members 175cd are separated from data lines 171. One side of each fourth electrode member 175cd functions as a third output electrode 175c opposite to the third input electrode 173c with respect to the semiconductor island 154c, and the other side of each fourth electrode member 175cd functions as a fourth output electrode 175d of which portions overlap the semiconductor island 154d.

Each driving voltage line 172 includes a linear portion 178 extending substantially in the longitudinal direction, and a plurality of projections 174 projecting from the linear portion 178. In addition, portions of the driving voltage lines 172 function as fourth input electrodes 173d of which at least one portion overlaps the fourth control electrodes 124d. The fourth input electrodes 173d1 of the blue pixels B are formed between the linear portion 178 and the projections 174 and the fourth input electrodes 173d2 and 173d3 are formed on portions of the linear portions 178. The fourth control electrodes 124d1 of the blue pixels B overlap projections 174 of the driving voltage lines 172 of the adjacent green pixels G, as well as the driving voltage lines 172 of the blue pixels B.

The fourth output electrodes 175d1, 175d2, and 175d3 in three pixels B, G, and R have sizes and shapes that are different from each other, and the fourth output electrodes 175d1 of the blue pixels B are formed like the character "ㄱ" and have the largest size. Meanwhile, each of the fourth output electrodes 175d2 and 175d3 of the remaining two pixels G and R has a lesser length than that of the second output electrode 175d1, or a bar-shape. However, the fourth output electrodes 175d1, 175d2, and 175d3 may have various shapes and sizes depending on channel widths of the driving transistors Qd11, Qd12, and Qd13.

A passivation layer 180 is formed on the data conductors 171, 172, 175a, 175cd, and 176 and the exposed portions of the semiconductor islands 154a-154d. The passivation layer 180 has a plurality of contact holes 182, 185a, and 185d exposing the end portions 179 of data lines 171, the first output electrodes 175a, and the fourth output electrodes 175d, respectively, and the passivation layer 180 and the gate insulating layer 140 have a plurality of contact holes 181 and 184 exposing the end portions 129 of gate lines 121 and the second control electrodes 124b, respectively.

A plurality of pixel electrodes 191, a plurality of connecting members 85, and a plurality of contact assistants 81 and 82 are formed on the passivation layer 180.

The pixel electrodes 191 are connected to the fourth output electrodes 175d through the contact holes 185d.

The connecting members 85 are connected to the fourth control electrodes 124d and the first output electrodes 175a through the contact holes 185a and 184, respectively.

The contact assistants 81 and 82 are connected to the end portions 129 of gate lines 121 and the end portions 179 of data lines 171 through the contact holes 181 and 182, respectively.

A partition 361 including a plurality of openings 365 is formed on the passivation layer 180. In addition, a plurality of organic light-emitting members 370 are formed on the pixel electrodes 191 and confined in the openings 365 defined by the partition 361 A common electrode 270 is formed on the organic light-emitting members 370 and the partition 361.

In the above-described OLED display, a first control electrode 124a connected to a gate line 121, a first input electrode 173a connected to a data line 171, and a first output electrode 175a along with a first semiconductor island 154a form a first switching TFT Qs1, and a second control electrode 124b connected to a gate line 121, a second input electrode 173b connected to a data line 171, and a second output electrode 175b along with a second semiconductor island 154b form a second switching TFT Qs2.

The first switching transistor Qs1 has a channel formed in the semiconductor island 154a disposed between the first input electrode 173a and the first output electrode 175a, and the second switching transistor Qs2 has a channel formed in the second semiconductor island 154b disposed between the second input electrode 173b and the second output electrode 175b.

Likewise, a third control electrode 124c, a third input electrode 173c, and a third output electrode 175c along with a third semiconductor island 154c form a first driving transistor Qd1, and a fourth control electrode 124d, a fourth input electrode 173d connected to a driving voltage line 172, and a fourth output electrode 175d along with a fourth semiconductor island 154d form a second driving transistor Qd2.

The first driving transistor Qd1 has a channel formed in the second semiconductor island 154b disposed between the second source electrode 173b and the second drain electrode 175b, and the second driving transistor Qd2 has a channel formed in the fourth semiconductor island 154d disposed between the fourth input electrode 173d and the fourth output electrode 175d.

As in the above-described embodiment, the overlapping portions of a fourth control electrode 124d and a driving voltage line 172 form a storage capacitor Cs. In a blue pixel B that has the lower luminous efficiency, the voltage storing capacity of the storage capacitor Cs is enhanced by enlarging an overlapping area of a fourth control electrode 124d and a driving voltage line 172.

As described above, by increasing the capacitance of the storage capacitor of the pixel B having the lower luminous efficiency, the kickback voltage decreases, and thereby a decrement of a current applied to the OLED LD of the pixel B is prevented. Accordingly, a decrement of luminance of the LOED LD of the blue pixel B having the lower luminous efficiency is also prevented.

Furthermore, the luminous efficiency decreases in the order of green, red, and blue pixels G, R, and B, but the order may be varied based on a light-emitting material, in which case the present invention may still be employed.

The present invention has been described in connection with what is considered to be practical exemplary embodiments, it is to be understood that various modifications and equivalent arrangements will be apparent to those skilled in the art and may be made without, however, departing from the spirit and scope of the invention.

What is claimed is:

1. An organic light-emitting diode (OLED) display comprising:
   a first pixel including a first light-emitting diode, a first driving transistor connected to the first light-emitting diode and having a first terminal, a second terminal, and a third terminal, and a first storage capacitor connected between the first terminal and the second terminal of the first driving transistor;
   a second pixel including a second light-emitting diode, a second driving transistor connected to the second light-emitting diode and having a first terminal, a second terminal, and a third terminal, and a second storage capacitor connected between the first terminal and the second terminal of the second driving transistor, and
   a plurality of data lines for transmitting a data signal;
   wherein a first terminal of the first storage capacitor intersects a data line of the plurality of data lines disposed between the first pixel and the second pixel.

2. The OLED display of claim 1,
   wherein the first light-emitting diode has a lower luminous efficiency than the second light-emitting diode,
   wherein the first storage capacitor has a larger capacitance than the second storage capacitor,
   wherein the first pixel has substantially the same size as the second pixel,
   wherein the first light-emitting diode emits light of a blue color, and the second light-emitting diode emits light of a green or red color.

3. The OLED display of claim 1, further comprising:
   a first driving voltage line connected to the first driving transistor, for transmitting a driving voltage;
   a second driving voltage line connected to the second driving transistor, for transmitting a driving voltage;
   a gate line for transmitting a gate signal; and
   wherein the first pixel further comprises a switching transistor connected to the gate line, one data line of the plurality of data lines, and the first driving transistor,
   wherein the second pixel further comprises a second switching transistor connected to the gate line, another data line of the plurality of data lines, and the second driving transistor,
   wherein the first storage capacitor comprises the first terminal connected to the first terminal of the first driving transistor and a second terminal connected to the second terminal of the first driving transistor, and
   wherein the second terminal of the first storage capacitor is connected to the first and second driving voltage lines.

4. The OLED display of claim 3, wherein the first terminal of the first driving transistor is connected to the first switching transistor, and the first terminal of the second driving transistor is connected to the second switching transistor.

5. The OLED display of claim 4, wherein the first driving transistor has a channel width that is larger than a channel width of the second driving transistor.

6. The OLED display of claim 1, wherein the first light-emitting diode has the same area as the second light-emitting diode.

7. The OLED display of claim 1, further comprising a third pixel including a third light-emitting diode, a third driving transistor connected to the third light-emitting diode and having a first terminal, a second terminal, a third terminal, and a third storage capacitor connected between the first terminal and the second terminal of the third driving transistor, wherein the third driving transistor has a channel width that is less than a channel width of the first driving transistor and that is larger than a channel width of the second driving transistor.

8. The OLED display of claim 7, wherein the first light-emitting diode has lower luminous efficiency than the second light-emitting diode, and the second light-emitting diode has greater luminous efficiency than the third light-emitting diode.

9. The OLED display of claim 8, wherein the first light-emitting diode emits light of a blue color, the second light-emitting diode emits light of a green color, and the third light-emitting diode emits light of a red color.

10. An organic light-emitting diode (OLED) display comprising:
    a gate line extending in a first direction;
    first and second data lines extending in a second direction and separated from each other;
    first and second driving voltage lines extending in the second direction and disposed in turn with respect to the first and second data lines;
    a first switching transistor connected to the gate line and the first data line;
    a first driving transistor comprising a first control electrode connected to the first switching transistor;
    a first light-emitting diode connected to the first driving transistor;
    a second switching transistor connected to the gate line and the second data line;
    a second driving transistor connected to the second switching transistor and having a second control electrode; and
    a second light-emitting diode connected to the second driving transistor,
    wherein the first control electrode overlaps the second driving voltage line.

11. The OLED display of claim 10, wherein the first control electrode comprises an intersecting portion that intersects at least one of the first data line and the second data line.

12. The OLED display of claim 11, wherein the second driving voltage line comprises a protrusion that overlaps the intersecting portion of the first control electrode.

13. The OLED display of claim 12, wherein the intersecting portion of the first control electrode and the protrusion of the second driving voltage line extend in the first direction.

14. The OLED display of claim 13, wherein the first control electrode further comprises a first portion extending in the second direction and a second portion extending in a direction opposite to the second direction.

15. The OLED display of claim 14, wherein the first light-emitting diode comprises a first side adjacent to the first portion of the first control electrode and a second side adjacent to the second portion of the first control electrode.

16. The OLED display of claim 15, wherein the second control electrode extends in the first direction, and the second light-emitting diode comprises a first side adjacent to the second control electrode and a second side adjacent to the intersecting portion of the first control electrode.

17. The OLED display of claim 16, further comprising:
    a third data line extending in the second direction and separated from the first data line and the second data line;
    a third driving voltage line extending to the second direction;
    a third switching transistor connected to the gate line and the third data line;
    a third driving transistor connected to the third switching transistor and having a third control electrode extending in the second direction; and
    a third light-emitting diode connected to the third driving transistor, wherein the third control electrode overlaps the third driving voltage line, and an overlapping area of the third control electrode and the third driving voltage line is larger than an overlapping area of the second control electrode and the second driving voltage line and less than an overlapping area of the first control electrode and the first and second driving voltage lines.

18. The OLED display of claim 17, wherein the first light-emitting diode emits light of a blue color, the second light-emitting diode emits light of a green color, and the third light-emitting diode emits light of a red color.

19. An organic light-emitting diode (OLED) display comprising:
   a gate line for transmitting a gate signal;
   a data line intersecting the gate line, for transmitting a data signal;
   first and second driving voltage lines intersecting one of the gate line and the data line, for transmitting driving voltages;
   a first driving transistor connected to the first driving voltage line and having a first terminal, a second terminal, and a third terminal;
   a second driving transistor connected to the second driving voltage line and having a first terminal, a second terminal, and a third terminal;
   a first storage capacitor including a first terminal connected to the first terminal of the first driving transistor and a second terminal connected to the second terminal of the first driving transistor and the first and second driving voltage lines; and
   a second storage capacitor connected to the first and second terminals of the second driving transistor,
   wherein the first terminal of the first storage capacitor intersects the data line.

20. The OLED display of claim 19, wherein the first storage capacitor has a different capacitance than the second storage capacitor.

* * * * *